(12) United States Patent
Jo et al.

(10) Patent No.: US 8,031,002 B2
(45) Date of Patent: Oct. 4, 2011

(54) BUFFER AMPLIFIER

(75) Inventors: Byeong Hak Jo, Gyunggi-Do (KR); Yoo Sam Na, Seoul (KR); Yoo Hwan Kim, Gyunggi-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/504,127

(22) Filed: Jul. 16, 2009

(65) Prior Publication Data

US 2010/0134188 A1  Jun. 3, 2010

(30) Foreign Application Priority Data

Dec. 3, 2008 (KR) .................. 10-2008-0122091

(51) Int. Cl.
*H03F 3/26* (2006.01)
(52) U.S. Cl. ....................... 330/267; 330/264
(58) Field of Classification Search .......... 330/262–274, 330/255
See application file for complete search history.

(56) References Cited

U.S. PATENT DOCUMENTS

| 5,760,649 | A | 6/1998 | Michail et al. | |
|---|---|---|---|---|
| 6,657,496 | B2 * | 12/2003 | Chen et al. | 330/263 |
| 7,728,670 | B1 * | 6/2010 | Kim | 330/263 |
| 2009/0251217 | A1 * | 10/2009 | Keerti | 330/264 |

FOREIGN PATENT DOCUMENTS

| KR | 1020040039895 A | 5/2004 |
|---|---|---|
| KR | 1020070003286 A | 1/2007 |
| KR | 1020080073875 A | 8/2008 |

OTHER PUBLICATIONS

Korean Office Action for application No. 10-2008-0122091, issued Jun. 25, 2010.

* cited by examiner

*Primary Examiner* — Hieu Nguyen
(74) *Attorney, Agent, or Firm* — Lowe, Hauptman, Ham & Berner, LLP

(57) ABSTRACT

A buffer amplifier has high input impedance and is less affected by temperature by supplying independent bias power to each of amplification units. The buffer amplifier includes a bias supply unit supplying bias power having a preset voltage level, an amplification unit receiving preset driving power and the bias power from the bias supply unit to amplify an input signal, and a compensation unit compensating for current unbalance of the driving power supplied to the amplification unit.

9 Claims, 3 Drawing Sheets

BUFFER AMPLIFIER

CROSS-REFERENCE TO RELATED APPLICATIONS

This application claims the priority of Korean Patent Application No. 2008-0122091 filed on Dec. 3, 2008, in the Korean Intellectual Property Office, the disclosure of which is incorporated herein by reference.

BACKGROUND OF THE INVENTION

1. Field of the Invention

The present invention relates to a buffer amplifier, and more particularly, to a buffer amplifier that has high input impedance and is less affected by temperature by supplying independent bias power to each of amplification units.

2. Description of the Related Art

In general, wireless communications systems include various wireless communication circuit blocks in order to perform operations such as amplification, filtering and frequency conversion on signals. Buffer amplifiers are used between various wireless communication circuit blocks to prevent a subsequent circuit block from electrically affecting a previous circuit block, prevent voltage drops which may occur when the input impedance of a subsequent circuit block is low, or prevent a fluctuation in the electrical characteristics of a previous circuit block due to external causes.

In general, the higher the input impedance and the lower the output impedance, the better buffer amplifiers are. Also, buffer amplifiers need to satisfy the characteristic of constant voltage gain as the occasion arises.

To realize the above characteristics, various types of related art buffer amplifiers have been developed. Representative examples of buffer amplifiers include source-follower type, differential type, and inverter type buffer amplifiers.

Source-follower type buffer amplifiers are widely utilized in wireless communication circuits because of their relatively high input impedance and low output impedance, but have limitations in that voltage gain is smaller than 0 dB all the time.

Differential type buffer amplifiers are robust against common noise and allow constant voltage gain, but use inductors or resistors as loads. In the case of using inductors, the differential type buffer amplifiers increase in volume and cause large voltage gain at a specific frequency. In the case of using resistors, differential type buffer amplifiers result in large current consumption and voltage drop, thus failing to increase output voltage, and have relatively high output impedance.

Inverter type buffer amplifiers have limitations concerning their high levels of operating input voltage, current consumption varying with conditions, and relatively high output impedance. To solve the limitations of inverter type buffer amplifiers, inverter type buffer amplifiers receiving a current source or DC bias have been developed. However, inverter type buffer amplifiers receiving the current source have relatively high output impedance and it is difficult to use them in low voltage processes. In inverter type buffer amplifiers receiving the DC voltage, voltage gain deteriorates rapidly depending on conditions involving process, voltage and temperature (hereinafter, referred to PVT conditions).

SUMMARY OF THE INVENTION

An aspect of the present invention provides a buffer amplifier that has high input impedance and is less affected by temperature by supplying independent bias power to each of amplification units.

According to an aspect of the present invention, there is provided a buffer amplifier including: a bias supply unit supplying bias power having a preset voltage level; an amplification unit receiving preset driving power and the bias power from the bias supply unit to amplify an input signal; and a compensation unit compensating for a current imbalance in the driving power supplied to the amplification unit.

The bias power may include a first bias power having a preset voltage level, and a second bias power having a higher voltage level than that of the first bias power.

The amplification unit may include: a first amplifier connected between a driving power terminal and a ground terminal, and receiving the first bias power to amplify the input signal; and a second amplifier connected in series to the first amplifier between the first amplifier and the ground terminal, and receiving the second bias power to amplify the input signal.

The first amplifier may be a P-channel metal oxide semiconductor field-effect transistor (MOS FET), and the second amplifier may be an N-channel MOS FET.

The amplification unit may include: a first capacitor delivering the input signal to the first amplifier and blocking the DC component of the input signal; a second capacitor delivering the input signal to the second amplifier and blocking the DC component of the input signal; a first resistor delivering the first bias power to the first amplifier and blocking the AC component of the first bias power; and a second resistor delivering the second bias power to the second amplifier and blocking the AC component of the second bias power.

The bias supply unit may include: a current source supplying preset current; a first mirroring amplifier mirroring the current from the current source to supply the second bias power to the second amplifier; a second mirroring amplifier receiving the current from the first mirroring amplifier; and a third mirroring amplifier mirroring the current from the second mirroring amplifier to supply the first bias power to the first amplifier.

The compensation unit may include: a first compensation resistor connected between the driving power terminal and the ground terminal and connected in parallel to the first amplifier, the first compensation resistor forming a current path in which a driving current flowing into the first amplifiers flows toward the second amplifier, if the current level of the driving current flowing into the first amplifier is higher than that of a driving current flowing into the second amplifier; and a second compensation resistor connected in series between the first compensation resistor and the ground terminal and connected in parallel to the second amplifier, the second compensation resistor consuming the driving current flowing into the second amplifier if the current level of the driving current flowing into the second amplifier is higher than that of the driving current flowing into the first amplifier.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
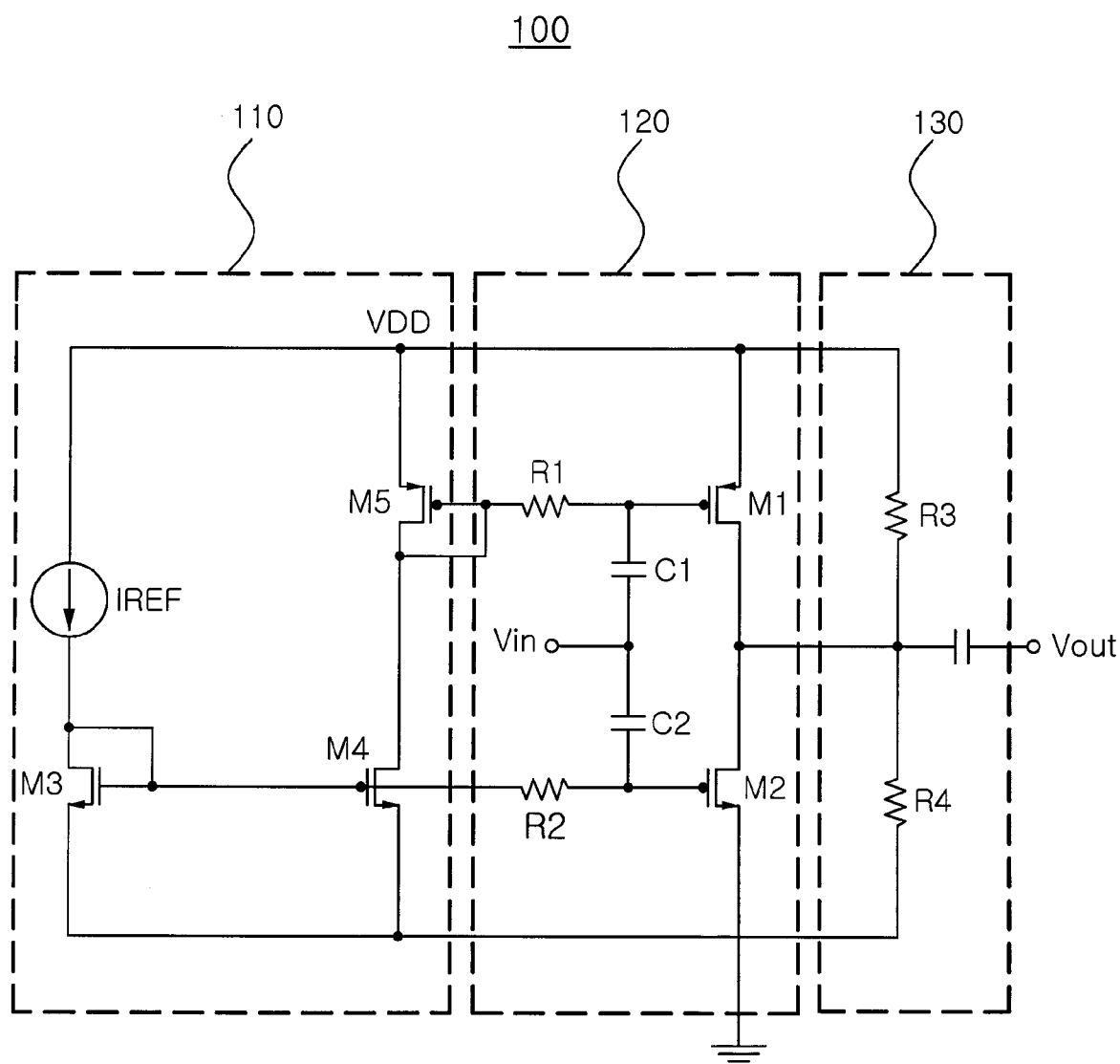
FIG. 1 is a circuit diagram of a buffer amplifier according to an exemplary embodiment of the present invention.

FIG. 1 is a circuit diagram of a buffer amplifier according to an exemplary embodiment of the present invention.

Referring to FIG. 1, the buffer amplifier 100, according to this embodiment, includes a bias supply unit 110, an amplification unit 120, and a compensation unit 130.

The bias supply unit 110 supplies the first bias power and the second bias power, each having a preset voltage level, to the amplification unit 120.

The amplification unit 120 includes first and second amplifiers M1 and M2 connected in series between a ground terminal and a driving power terminal supplying preset driving power VDD. The first and second amplifiers M1 and M2 receive the first bias power and the second bias power, respectively.

That is, the first amplifier M1 receives the first bias power to amplify an input signal Vin. The second amplifier M2 receives the second bias power to amplify the input signal Vin.

The first amplifier M1 may be configured as a P-channel metal oxide semiconductor field-effect transistor (MOS FET), and the second amplifier M2 may be configured as an N-channel MOS FET.

Accordingly, the voltage level of the first bias power may be set to be lower than the voltage level of the second bias power in order for the first and second amplifiers M1 and M2 to operate in a saturation region. Since each amplifier is provided with independent bias power of a different voltage level, constant electrical characteristics can be obtained under predetermined PVT conditions.

For the independent supply of the first and second bias power, the bias supply unit 110 may include a current source IREF, and first to third mirroring amplifiers M3, M4 and M5.

The current source IREF supplies a preset current, and the first mirroring amplifier M3 mirrors the current output from the current source IREF to the second mirroring amplifier M4 and the second amplifier M2, thereby supplying the second bias power to the second amplifier M2. The third mirroring amplifier M5 mirrors the current, output from the second mirroring amplifier M4, to the first amplifier M1, thereby supplying the first bias power to the first amplifier M1.

The amplification unit 120 may further include first and second capacitors C1 and C2, and first and second resistors R1 and R2.

The first and second resistors R1 and R2 deliver the first bias power and the second bias power to the first amplifier M1 and the second amplifier M2, respectively. The first and second resistors R1 and R2 block the AC components of the first bias power and the second bias power, respectively.

The first and second amplifiers M1 and M2 of the amplification unit 120 receive and amplify the input signal Vin, and the first and second capacitors C1 and C2 deliver the input signal Vin to the first and second amplifiers M1 or M2, respectively. Here, the first and second capacitors C1 and C2 block the DC components of the input signal Vin.

In the fabricating process of the buffer amplifier 100 according to this embodiment, the widths of the first and second amplifiers M1 and M2 are made to be greater than those of the second and third mirroring amplifiers M4 and M5, and the first and second amplifiers M1 and M2 are made to have the same width. Also, the widths of the second and third mirroring amplifiers M4 and M5 are controlled such that the first and second amplifiers M1 and M2 have the identical transconductance (gm), thereby increasing input impedance.

However, the greater widths of the first and second amplifiers M1 and M2 than those of the second and third mirroring amplifiers M4 and M5 increases the current consumption of the first and second amplifiers M1 and M2. In addition, the first and second amplifiers M1 and M2 may not have exactly the same width due to process errors. Accordingly, a current imbalance may occur, which refers to different levels of currents flowing into the first and second amplifiers M1 and M2.

Therefore, the compensation unit 130 includes first and second compensation resistors R3 and R4. The first compensation resistor R3 is connected to the first amplifier M1 in parallel, and the second compensation resistor R4 is connected to the second amplifier M1 in parallel. Also, like the first and second amplifiers M1 and M2, the first and second compensation resistors R3 and R4 are connected in series to each other between the driving power terminal VDD and the ground terminal. Thus, the first and second compensation resistors R3 and R4 compensate for the current unbalance between the currents flowing in the first and second amplifiers M1 and M2.

If the current level of the driving current flowing into the first amplifier M1 is higher than the current level of the driving current flowing into the second amplifier M2, the first compensation resistor R3 forms the current path of the driving power terminal-the first compensation resistor R3-the second amplifier M2 so as to cause the driving current flowing into the first amplifier M1 to flow toward the second amplifier M2. Thus, the first compensation resistor R3 equalizes the current level of the driving current flowing into the first amplifier M1 with the current level of the driving current flowing in the second amplifier M2.

If the current level of the driving current flowing into the second amplifier M2 is higher than that of the first amplifier M1, the second compensation resistor R4 equalize the current level of the driving current flowing in the first and second amplifiers M1 and M2 by consuming the driving current flowing into the second amplifier M2.

Thus, the first and second compensation resistors R3 and R4 may have equal resistance values.

Figure 2A:
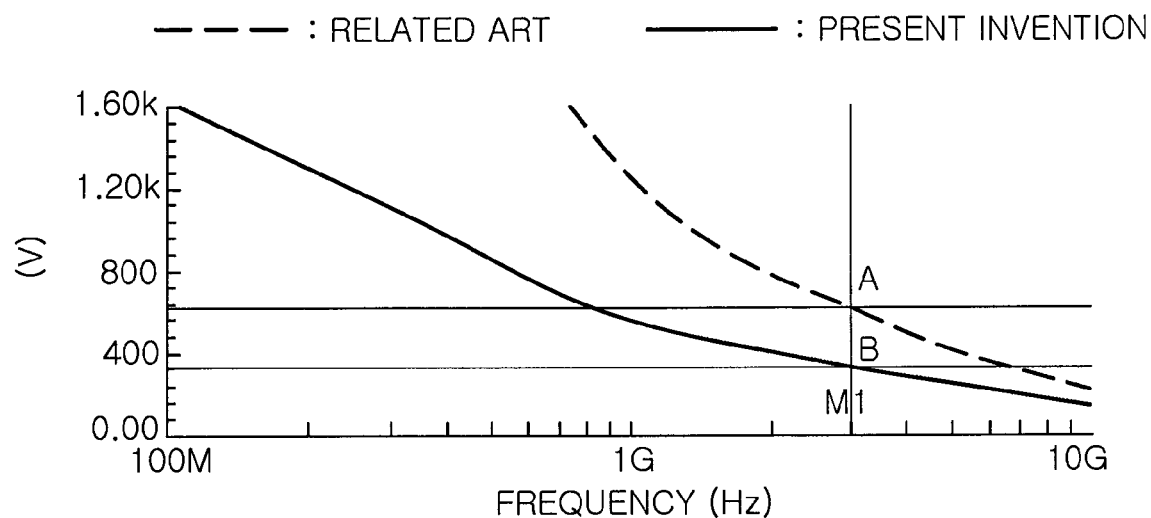
FIG. 2A is a graph showing the input impedance of a related art buffer amplifier and a buffer amplifier according to an exemplary embodiment of the present invention.
Figure 2B:
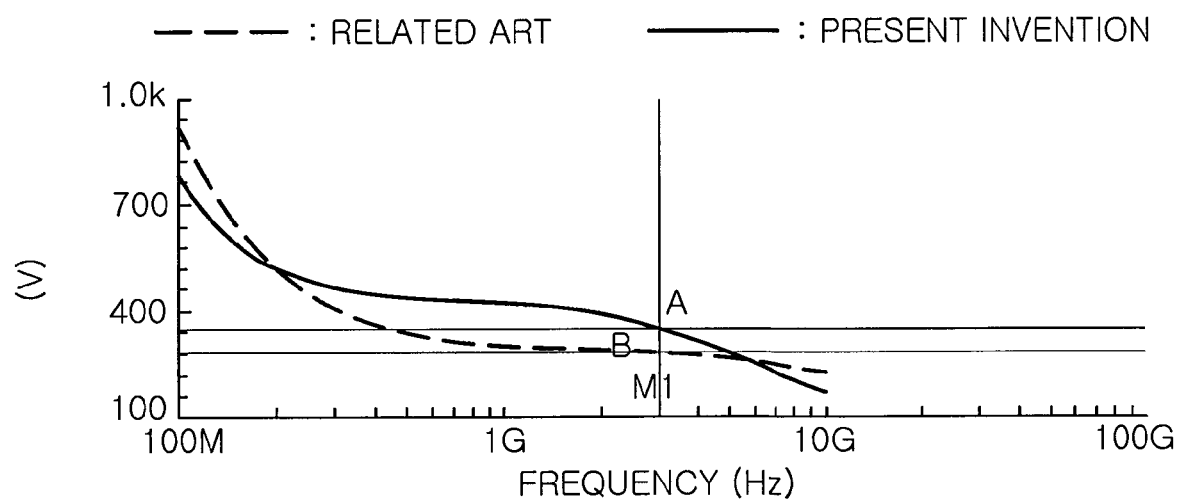
FIG. 2B is a graph showing the output impedance of the related art buffer amplifier and the buffer amplifier of FIG. 2A.

FIG. 2A is a graph showing the input impedance of a related art buffer amplifier and a buffer amplifier according to an exemplary embodiment of the present invention. FIG. 2B is a graph showing the output impedance of the related art buffer amplifier and the buffer amplifier according to the exemplary embodiment of the present invention.

As can be seen from reference characters A and B in FIG. 2A, the input impedance of the buffer amplifier, according to the exemplary embodiment of the present invention, is greater than that of the related art inverter type buffer amplifier receiving DC bias, by about 80%.

Likewise, as can be seen from reference characters A and B in FIG. 2B, the output impedance of the buffer amplifier, according to the exemplary embodiment of the present invention, is smaller than that of the inverter type buffer amplifiers receiving DC bias in a frequency band mainly used by wireless communications systems, by about 20%.

Figure 3A:
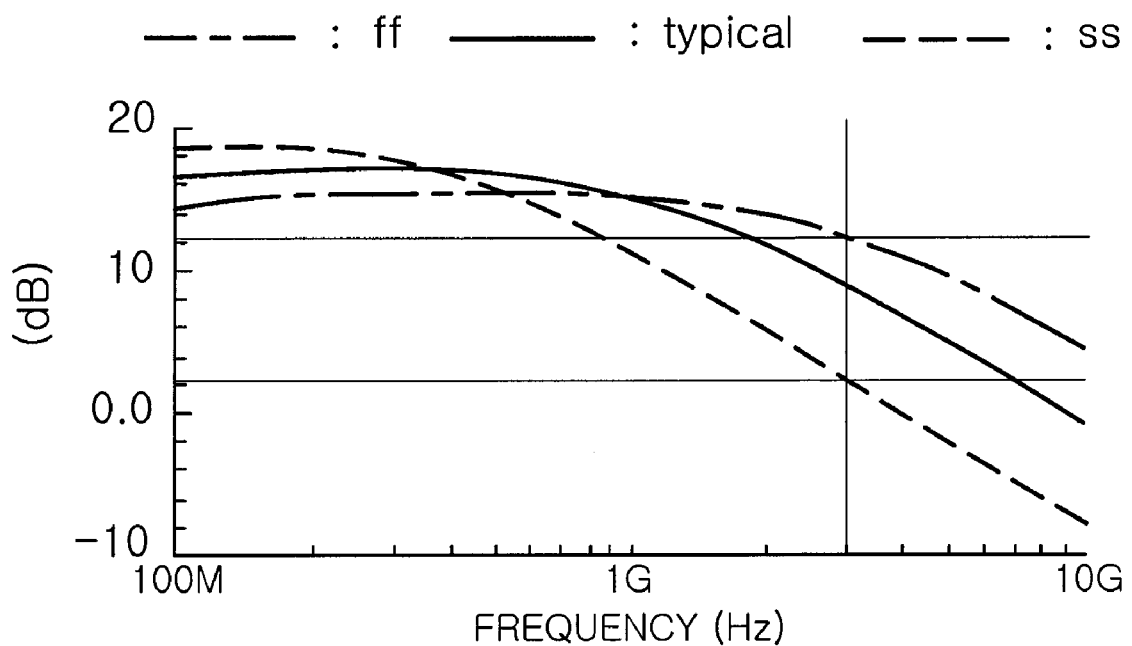
FIG. 3A is a graph showing the electrical characteristics of a related art buffer amplifier under predetermined PVT conditions.
Figure 3B:
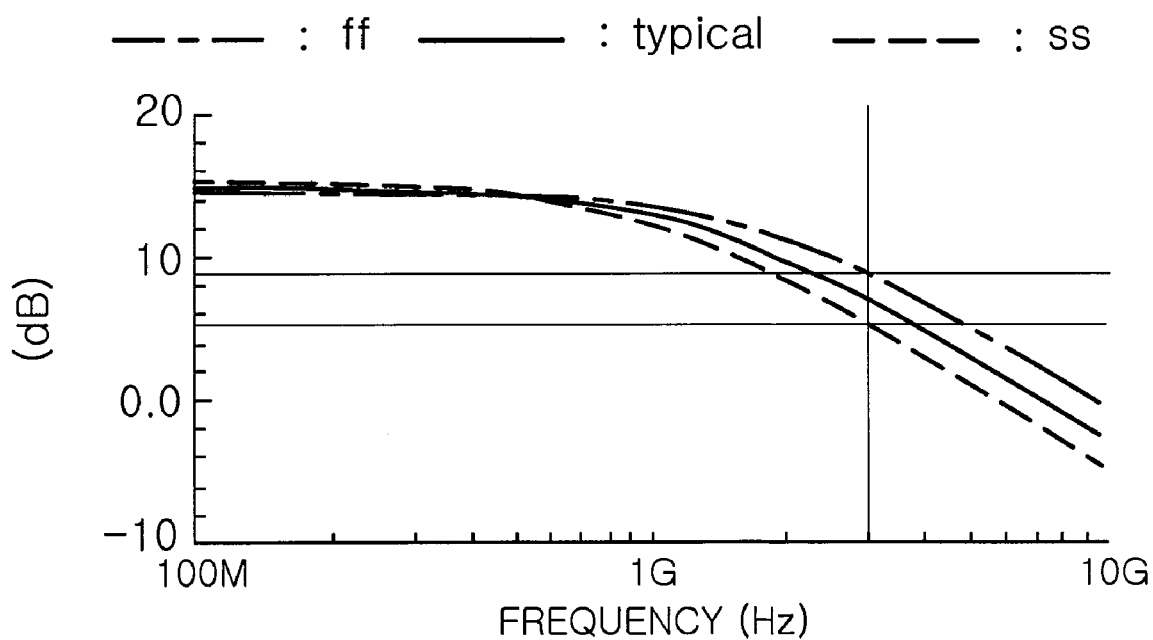
FIG. 3B is a graph showing the electrical characteristics of a buffer amplifier according to an exemplary embodiment of the present invention under the predetermined PVT conditions.

FIG. 3A is a graph showing the electrical characteristics of a related art buffer amplifier under predetermined PVT conditions. FIG. 3B is a graph showing the electrical characteristics of the buffer amplifier according to the exemplary embodiment of the present invention under the same predetermined PVT conditions.

As for the predetermined PVT conditions applied to the related art inverter type buffer amplifier receiving a DC bias and the buffer amplifier according to the exemplary embodiment of the present invention, a first PVT condition 'ff' involves a fast MOS FET generation process, low temperature, and high voltage (set to be higher than rated voltage by 10%), and a third PVT condition 'ss', on the other hand, involves a slow MOS FET generation process, high temperature and low voltage (set to be lower than rated voltage by 10%). A second PVT condition 'typical' is set to the mean of the first PVT condition 'ff' and the third PVT condition 'ss'.

As can be seen from reference characters A and B in FIGS. 3A and 3B, the related art buffer amplifier undergoes a fluctuation in voltage gain from 2.3 dB to 12.3 dB at a frequency of 3 GHz depending on the PVT conditions. In contrast, the voltage gain of the buffer amplifier, according to the exemplary embodiment of the present invention, fluctuates to a relatively small extent from 5.3 dB to 8.8 dB at a frequency of 3 GHz depending on the PVT conditions.

As compared to the related art buffer amplifiers, the buffer amplifiers, according to the embodiments of the present invention, achieve higher input impedance, lower output impedance, smaller fluctuations in voltage gain, and stable electrical characteristics, even when the PVT conditions are changed.

As set forth above, according to exemplary embodiments of the invention, the buffer amplifier has high input impedance and is less affected by temperature, since independent bias power is applied to each of amplification units.

While the present invention has been shown and described in connection with the exemplary embodiments, it will be apparent to those skilled in the art that modifications and variations can be made without departing from the spirit and scope of the invention as defined by the appended claims.

What is claimed is:

1. A buffer amplifier comprising:
a bias supply unit for supplying a first bias power and a second bias power having a preset voltage level by mirroring an input power;
an amplification unit for receiving preset driving power and the bias power from the bias supply unit to amplify an input signal; and
a compensation unit for compensating for a current imbalance in the driving power supplied to the amplification unit;
wherein the amplification unit comprises:
a first amplifier connected between a driving power terminal and a ground terminal for receiving the first bias power to amplify the input signal; and
a second amplifier connected in series to the first amplifier between the first amplifier and the ground terminal for receiving the second bias power to amplify the input signal; and
wherein the compensation unit is further configured to compensate for current imbalance flowing through the first amplifier and the second amplifier.

2. The buffer amplifier of claim 1, wherein the second bias power has a higher preset voltage level than that of the first bias power.

3. The buffer amplifier of claim 2, wherein the first amplifier is a P-channel metal oxide semiconductor field-effect transistor (MOS FET), and the second amplifier is an N-channel MOS FET.

4. The buffer amplifier of claim 2, wherein the amplification unit comprises:
a first capacitor for delivering the input signal to the first amplifier and for blocking the DC component of the input signal;
a second capacitor for delivering the input signal to the second amplifier and for blocking the DC component of the input signal;
a first resistor for delivering the first bias power to the first amplifier and for blocking the AC component of the first bias power; and
a second resistor for delivering the second bias power to the second amplifier and for blocking the AC component of the second bias power.

5. A buffer amplifier comprising:
a bias supply unit for supplying a first bias power and a second bias power having a preset voltage level by mirroring an input power;
an amplification unit for receiving preset driving power and the bias power from the bias supply unit to amplify an input signal; and
a compensation unit for compensating for a current imbalance in the driving power supplied to the amplification unit;
wherein the amplification unit comprises:
a first amplifier connected between a driving power terminal and a ground terminal for receiving the first bias power to amplify the input signal; and
a second amplifier connected in series to the first amplifier between the first amplifier and the ground terminal for receiving the second bias power to amplify the input signal; and
wherein the bias supply unit comprises:
a current source for supplying preset current;
a first mirroring amplifier for mirroring the current from the current source to supply the second bias power to the second amplifier;
a second mirroring amplifier for receiving the current from the first mirroring amplifier; and
a third mirroring amplifier for mirroring the current from the second mirroring amplifier to supply the first bias power to the first amplifier.

6. A buffer amplifier comprising:
a bias supply unit for supplying a first bias power and a second bias power having a preset voltage level by mirroring an input power;
an amplification unit for receiving preset driving power and the bias power from the bias supply unit to amplify an input signal; and
a compensation unit for compensating for a current imbalance in the driving power supplied to the amplification unit;
wherein the amplification unit comprises:
a first amplifier connected between a driving power terminal and a ground terminal for receiving the first bias power to amplify the input signal; and
a second amplifier connected in series to the first amplifier between the first amplifier and the ground terminal for receiving the second bias power to amplify the input signal; and
wherein the compensation unit comprises:
a first compensation resistor connected between the driving power terminal and the ground terminal and connected in parallel to the first amplifier, the first compensation resistor forming a current path in which a driving current flowing into the first amplifiers flows toward the second amplifier, if the current level of the driving current flowing into the first amplifier is higher than that of a driving current flowing into the second amplifier; and a second compensation resistor connected in series between the first compensation resistor and the ground terminal and connected in parallel to the second amplifier, the second compensation resistor consuming the driving current flowing into the second amplifier if the current level of the driving current flowing into the second amplifier is higher than that of the driving current flowing into the first amplifier.

7. A buffer amplifier comprising:

a bias supply unit for supplying bias power having a preset voltage level;

an amplification unit for receiving preset driving power and the bias power from the bias supply unit to amplify an input signal; and a compensation unit for compensating due to a current imbalance in the driving power supplied to the amplification unit;

wherein the bias power comprises a first bias power having a preset voltage level, and a second bias power having a higher voltage level than that of the first bias power;

wherein the amplification unit comprises:
a first amplifier connected between a driving power terminal and a ground terminal for receiving the first bias power to amplify the input signal;
a second amplifier connected in series to the first amplifier between the first amplifier and the ground terminal for receiving the second bias power to amplify the input signal;
a first capacitor for delivering the input signal to the first amplifier and blocking the DC component of the input signal;
a second capacitor for delivering the input signal to the second amplifier and blocking the DC component of the input signal;
a first resistor for delivering the first bias power to the first amplifier and blocking the AC component of the first bias power; and
a second resistor delivering the second bias power to the second amplifier and blocking the AC component of the second bias power; and wherein the compensation unit is further configured to compensate for current imbalance flowing through the first amplifier and the second amplifier.

8. A buffer amplifier comprising:

a bias supply unit for supplying bias power having a preset voltage level;

an amplification unit for receiving preset driving power and the bias power from the bias supply unit to amplify an input signal; and a compensation unit for compensating due to a current imbalance in the driving power supplied to the amplification unit;

wherein the bias power comprises a first bias power having a preset voltage level, and a second bias power having a higher voltage level than that of the first bias power;

wherein the amplification unit comprises:
a first amplifier connected between a driving power terminal and a ground terminal for receiving the first bias power to amplify the input signal;
a second amplifier connected in series to the first amplifier between the first amplifier and the ground terminal for receiving the second bias power to amplify the input signal; and wherein the bias supply unit comprises:
a current source for supplying preset current;
a first mirroring amplifier for mirroring the current from the current source to supply the second bias power to the second amplifier;
a second mirroring amplifier for receiving the current from the first mirroring amplifier; and
a third mirroring amplifier for mirroring the current from the second mirroring amplifier to supply the first bias power to the first amplifier.

9. A buffer amplifier comprising:

a bias supply unit for supplying bias power having a preset voltage level;

an amplification unit for receiving preset driving power and the bias power from the bias supply unit to amplify an input signal; and a compensation unit for compensating due to a current imbalance in the driving power supplied to the amplification unit;

wherein the bias power comprises a first bias power having a preset voltage level, and a second bias power having a higher voltage level than that of the first bias power;

wherein the amplification unit comprises:
a first amplifier connected between a driving power terminal and a ground terminal for receiving the first bias power to amplify the input signal;
a second amplifier connected in series to the first amplifier between the first amplifier and the ground terminal for receiving the second bias power to amplify the input signal; and wherein the compensation unit comprises:
a first compensation resistor connected between the driving power terminal and the ground terminal and connected in parallel to the first amplifier, the first compensation resistor forming a current path in which a driving current flowing into the first amplifiers flows toward the second amplifier, if the current level of the driving current flowing into the first amplifier is higher than that of a driving current flowing into the second amplifier; and
a second compensation resistor connected in series between the first compensation resistor and the ground terminal and connected in parallel to the second amplifier, the second compensation resistor consuming the driving current flowing into the second amplifier if the current level of the driving current flowing into the second amplifier is higher than that of the driving current flowing into the first amplifier.

* * * * *